(12) United States Patent
McFarland et al.

(10) Patent No.: US 7,688,063 B2
(45) Date of Patent: Mar. 30, 2010

(54) APPARATUS AND METHOD FOR ADJUSTING THERMALLY INDUCED MOVEMENT OF ELECTRO-MECHANICAL ASSEMBLIES

(75) Inventors: Andrew W. McFarland, Dublin, CA (US); Kevin Youl Yasumura, San Ramon, CA (US); Eric D. Hobbs, Livermore, CA (US); Keith J. Breinlinger, San Ramon, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/165,325

(22) Filed: Jun. 30, 2008

(65) Prior Publication Data

US 2009/0206860 A1 Aug. 20, 2009

Related U.S. Application Data

(60) Provisional application No. 61/029,860, filed on Feb. 19, 2008.

(51) Int. Cl.
*G01R 31/02* (2006.01)
(52) U.S. Cl. .............. 324/158.1; 324/754; 324/760
(58) Field of Classification Search .............. None
See application file for complete search history.

(56) References Cited

U.S. PATENT DOCUMENTS

| | | | |
|---|---|---|---|
| 6,509,751 B1 * | 1/2003 | Mathieu et al. | ............ 324/754 |
| 6,891,385 B2 | 5/2005 | Miller | |
| 6,972,578 B2 | 12/2005 | Martens et al. | |
| 7,002,363 B2 | 2/2006 | Mathieu | |
| 7,064,953 B2 | 6/2006 | Miller | |
| 7,071,714 B2 | 7/2006 | Eldridge et al. | |
| 7,285,968 B2 | 10/2007 | Eldridge et al. | |
| 7,307,435 B2 | 12/2007 | Mori | |
| 7,312,618 B2 | 12/2007 | Eldridge et al. | |
| 2005/0275418 A1 | 12/2005 | Chong et al. | |
| 2006/0061375 A1 * | 3/2006 | Mori | .................. 324/754 |
| 2006/0255814 A1 * | 11/2006 | Eldridge et al. | ............. 324/754 |
| 2008/0157790 A1 | 7/2008 | Hobbs | |
| 2008/0157791 A1 | 7/2008 | McFarland et al. | |

FOREIGN PATENT DOCUMENTS

| | | |
|---|---|---|
| JP | 02-264868 | 10/1990 |
| JP | 07-221144 | 8/1995 |
| JP | 08-293525 | 11/1996 |
| JP | 2006-214732 | 8/2006 |

OTHER PUBLICATIONS

U.S. Appl. No. 61/054,829, filed May 21, 2008, entitled "Probe Card Thermal Conditioning System", 23 pages.
PCT/US2009/034440, Written Opinion Of The International Searching Authority (Sep. 1, 2009), 8 pages.
PCT/US2009/034440, International Search Report (Sep. 1, 2009), 6 pages.

* cited by examiner

*Primary Examiner*—Minh N Tang
(74) *Attorney, Agent, or Firm*—N. Kenneth Burraston

(57) ABSTRACT

A thermal adjustment apparatus for adjusting one or more thermally induced movements of an electro-mechanical assembly includes: a compensating element expanding at a first rate different from a second rate at which the electro-mechanical assembly expands for generating a counteracting force in response to changes in temperature; and a coupling mechanism coupling the compensating element to the electro-mechanical assembly, and being adjustable to control an amount of the counteracting force applied to the electro-mechanical assembly as temperature changes.

41 Claims, 11 Drawing Sheets

APPARATUS AND METHOD FOR ADJUSTING THERMALLY INDUCED MOVEMENT OF ELECTRO-MECHANICAL ASSEMBLIES

CROSS-REFERENCE

This application claims the benefit of U.S. Provisional Application No. 61/029,860 filed Feb. 19, 2008.

BACKGROUND

The present invention generally relates to electro-mechanical assemblies, such as probe cards having electrical contacts for testing integrated circuits.

Electro-mechanical assemblies, such as probe cards, can be used in testing a die, e.g. integrated circuit devices, typically on semiconductor wafers. Such probe card is used in connection with a device known as a tester, wherein the probe card is electronically connected to the tester device, and in turn the probe card is also in electrical contact with the integrated circuit to be tested (either on a wafer or in singulated form) (as referred to herein an integrated circuit to be tested in any form is referred to as a device under test (DUT)).

Typically a wafer to be tested is loaded into a prober securing it to a movable chuck. During the testing process, the chuck moves the wafer into electrical contact with the probe card. This contact occurs between a plurality of probes on the probe card, which can be in the form of spring-type contacts, and a plurality of discrete connection pads (bond or test pads) on the DUTs. Several different types of electrical contacts are known and used on probe cards, including without limitation needle contacts, cobra-style contacts, spring contacts, and the like. In this manner, the DUTs can be tested and exercised, prior to being singulated from the wafer, or final packaging.

For effective contact between the probes of the probe card and the bond pads of the dies, the distance between the probe card and the wafer should be properly maintained. If portions of the DUT and the probes are too far apart contact can be lost, if they are too close together then damage may occur to the probes or the DUTs, or, for example, the probe can move from a desired location on the DUT.

The distance between the DUT and the probe card may change as the testing procedure proceeds, especially as the temperatures of the probe card and the wafer change during the testing process. In many instances, the wafer being tested may be heated or cooled during the testing process. When a wafer having a temperature different than that of the probe card is moved under the card, the card face nearest the wafer begins to change temperature. Probe cards are typically built of layers of different materials and are usually poor heat conductors in a direction normal to the face of the card. As a result, a thermal gradient across the thickness of the probe card can appear rapidly. As a result of this uneven expansion, the probe card can begin to sag, decreasing the distance between the probe card and the wafer. The opposite phenomenon may occur when a wafer is cooler than the ambient temperature of the tester is placed near the probe card. As the face of the probe card nearest the wafer cools and contracts faster than the face farthest from the wafer, the probe card begins to bow away from the wafer disrupting electrical contact between the wafer and the probe card.

Moreover, various parts of the probe card may have different coefficients of thermal expansion. As a result, they may expand or contract at different rates as the temperature of the environment in which the probe card and the wafer are placed for testing changes. This would also cause the probe card to deform, thereby moving the probes away from the pads on the wafer, and causing the test to fail.

Thus, what is needed is an apparatus for adjusting the thermally induced movement of probe cards, such that the probes can remain in proper contact with the pads of DUTs on wafers.

SUMMARY

Some embodiments of the invention are directed to a thermal adjustment apparatus for adjusting one or more thermally induced movements of an electro-mechanical assembly. The thermal adjustment apparatus can include a compensating element expanding at a first rate different from a second rate at which the electro-mechanical assembly expands for generating a counteracting force in response to changes in temperature. A coupling mechanism couples the compensating element to the electro-mechanical assembly, and is adjustable to control an amount of the counteracting force applied to the electro-mechanical assembly as temperature changes.

Some embodiments of the invention are directed to a process for adjusting an amount of coupling. The process can include providing a compensating element, providing an electro-mechanical assembly; and adjusting a coupling between the compensating element and the electro-mechanical assembly in accordance with a predetermined amount of thermal movement of the electro-mechanical assembly.

In some embodiments of the invention, one or more temperature control elements can be implemented to actively control the temperature of the compensating element. Thus, the counteracting force generated by the one or more compensating elements can be actively controlled.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the figures can show simplified or partial views, and the dimensions of elements in the figures can be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, over, under, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

The invention is directed to an apparatus for adjusting thermally induced movement of electro-mechanical assemblies, which include, but are not limited to, probe cards, and other composite structures having components that may deform under certain thermal conditions due to various coefficients of thermal expansion or non-uniform temperature fields thereof. The following embodiments of the invention are described using probe cards as a context for the purpose of clarity. However, it is understood by people skilled in the art that the proposed apparatus can be used to adjust the thermal movement of other electro-mechanical assemblies without deviating from the spirit of the invention.

Figure 1:
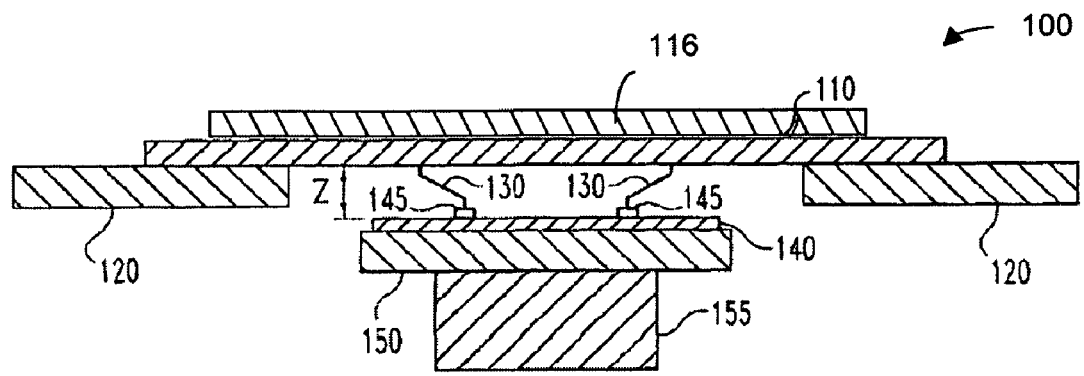
FIG. 1 partially illustrates a cross-sectional view of a probe card.

FIG. 1 shows a typical, idealized example of a probe card assembly 100 and DUT 140 loaded into a test system. In this and the other accompanying views, certain elements of certain components are shown exaggerated, for illustrative clarity. Additional components which may be mounted to or included in the probe card assembly, such as active and passive electronic components, connectors, substrates and the like, are omitted for clarity.

The probe card assembly 100 includes, but is not limited to, a circuit board substrate 110, a stiffener 116, and probes 130 attached to and extending from a bottom surface of the probe card assembly 100. The circuit board substrate 110 can include components, such as at least one probe head and at least one interposer, which will be further explained in greater detail in paragraphs below. The circuit board substrate 110 is supported by the head plate 120 when mounted in the test system, preferably parallel to a DUT 140, and most typically positioned directly above it. The probes 130 are resilient electro-mechanical contacts made in a miniature scale configured to make reliable pressure connections to DUTs. Typically, the probe card assembly 100 is connected to a tester by other electrical connection links (not shown).

As is known, a semiconductor DUT 140 includes a plurality of die sites (not shown) formed by photolithography, deposition, diffusion, and the like, on its front (upper, as viewed) surface. Each die site typically has a plurality (two of many shown) of bond pads 145, which may be disposed at any location and in any pattern on the surface of the die site.

Once the DUT 140 is mounted in the testing device, wafer chuck 150 including table actuator 155 lifts the DUT 140 to allow electronic contact between the probes 130 and their corresponding pads 145 on the DUT 140. The lifting mechanism may utilize a scissors mechanism, telescoping action, lever action, thread action, cam action or other lifting mechanisms. Once the DUT 140 is moved into electrical contact with the probe card assembly 110, the testing procedure may proceed.

During the test, the probes 130 and the pads 145 form a plurality of pressure contacts. For these contacts to be produced, the DUT 140 is urged to an effective distance Z (vertical as shown) from the circuit board substrate 110. As the probes 130 are generally resilient, the effective distance Z between the circuit board substrate 110 and the DUT 140 may differ from the unpressured height of the probes 130.

The probe card assembly 100 can include a stiffener 116 disposed on top of the circuit board substrate 110 to strengthen the circuit board substrate 110, thereby reducing the bending movement of the circuit board substrate 110 in the z-axis direction, such that the distance Z between the circuit board substrate 110 and the DUT 140 can remain more constant over the surface of the DUT 140. The stiffener 116 is often made of materials having an elastic modulus higher than that of circuit board substrate 110 in order to restrict the displacement of circuit board substrate 110 in the z-axis direction. However, since the stiffener 116 and the circuit board substrate 110 are made of different materials, they can have different coefficients of thermal expansion. In other words, the stiffener 116 and the circuit board substrate 110 may expand or contract at different rates as temperature changes, which may cause the composite structure of the circuit board substrate 110 and the stiffener 116 to bend with its middle portion being lower or higher than their edges.

Figure 2:
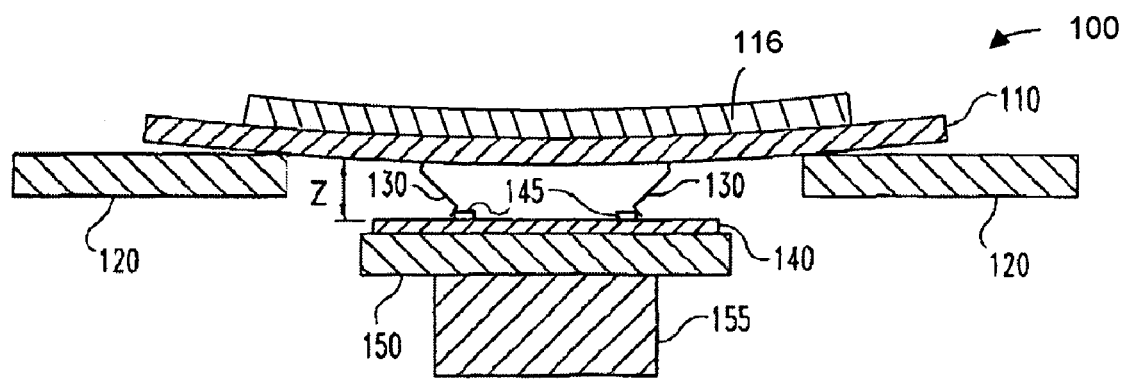
FIG. 2 partially illustrates a cross-sectional view of a probe card with thermally induced movement.

FIG. 2 illustrates a cross-sectional view of the probe card assembly 100 where the composite structure of the circuit board substrate 110 and the stiffener 116 deforms to have a downward facing bow shape as temperature changes. For example, assume the stiffener 116 is made of a material having a first coefficient of thermal expansion ($CTE_1$) less than a second coefficient of thermal expansion ($CTE_2$) of the circuit board substrate 110. As the temperature of the environment in which the probe card assembly 100 is placed increases, the circuit board substrate 110 would expand at a rate higher than that at which the stiffener 116 expands, thereby causing the composite structure of the circuit board substrate 110 and the stiffener 116 to bow with its middle portion between the two ends of the head plate 120 sinking toward the DUT 140. As a result, the probes 130 could be placed in higher compression, or move away from the pads 145, rendering the electrical contact there between insufficient or improper and causing the testing of the DUT 140 to fail, or possibly damaging the probes 130 due to over-compression.

Figure 3:
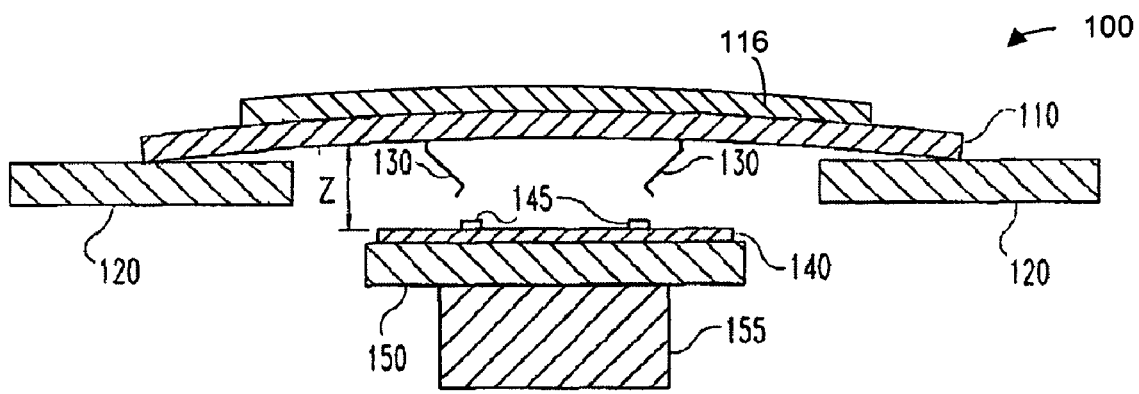
FIG. 3 partially illustrates a cross-sectional view of a probe card with thermally induced movement.

FIG. 3 illustrates a cross-sectional view of the probe card assembly 100 where the composite structure of the circuit board substrate 110 and the stiffener 116 deforms to have an upward facing bow shape as the temperature changes. For example, assume that $CTE_1$ of stiffener 116 is less than $CTE_2$ of the circuit board substrate 110. As the temperature of the environment in which the probe card assembly 100 is placed decreases, the circuit board substrate 110 would contract at a rate higher than that at which the stiffener 116 contracts, thereby causing the composite structure of the circuit board substrate 110 and the stiffener 116 to bow with its middle portion between the two ends of the head plate 120 rising away from the DUT 140. Alternatively, the $CTE_1$ of stiffener 116 could be greater than $CTE_2$ of the circuit board substrate 110. As the temperature of the environment in which the probe card assembly 100 is placed increases, the circuit board substrate 110 would expand at a rate less than that at which the stiffener 116 expands, thereby causing the composite structure of the circuit board substrate 110 and the stiffener 116 to bow with its middle portion between the two ends of the head plate 120 rising away from the DUT 140. As a result, the probes 130 could move away from the pads 145, rendering the electrical contact there between insufficient or improper and causing the testing of the DUT 140 to fail.

Figure 4:
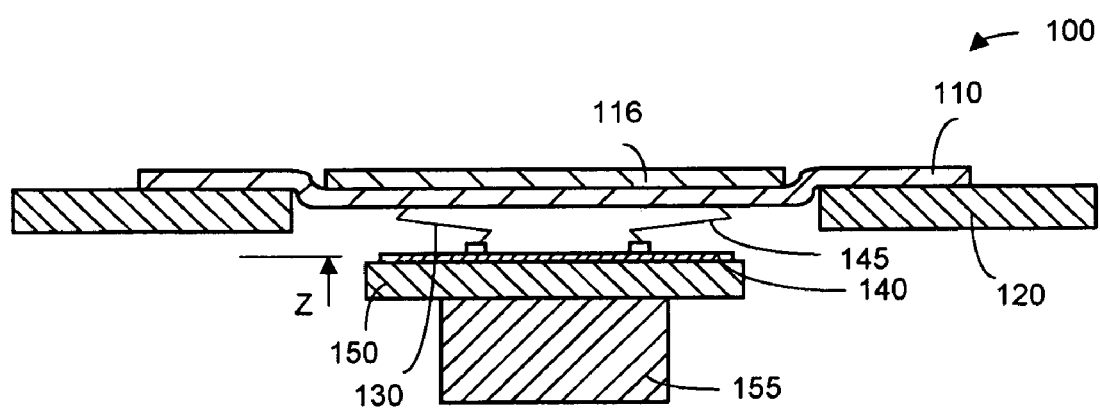
FIG. 4 partially illustrates a cross-sectional view of a probe card with thermally induced movement.

FIG. 4 illustrates a cross-sectional view of the probe card assembly 100 where the circuit board substrate 110 and the head plate 120 are fixedly attached to each other at their overlapping areas, which is designed to improve the planarity of the bottom surface of the circuit board substrate 110 from which the probes 130 extend. As shown in the figure, as the temperature of the environment in which the probe card assembly 100 is placed increases, a thermally induced deformation would have the circuit board substrate 110 sink toward the DUT 140 in a manner that the bottom surface of the circuit board substrate 110 facing the DUT 140 remains relatively planar, due to the fixed attachment between the overlapping areas of the circuit board substrate 110 and the head plate 120. The z-soak time, which is defined as the time required for the circuit board substrate 110 to reach a steady state in the z-displacement within a predetermined tolerance, should be as short as possible. The shorter the z-soak time, the quicker the probe card assembly 100 can be used to reliably test the DUT 140. However, the stiffener 116 attached to the circuit board substrate 110 may complicate the thermal transfer of the circuit board substrate 110, and therefore may prolong the z-soak time. Moreover, since the coefficients of thermal expansion of the circuit board substrate 110 and the stiffener 116 can be different, the portion of the circuit board substrate 110 surrounded by the head plate 120 may still bow in a manner as described in the paragraphs above with reference to FIGS. 2 and 3. As the semiconductor processing technology advances, the spacing pitch of the pads 145 decreases. Thus, any undesired relative movement between the probes 130 and the pads 145 can cause them to be out of contact, and therefore the testing to fail.

Figure 5:
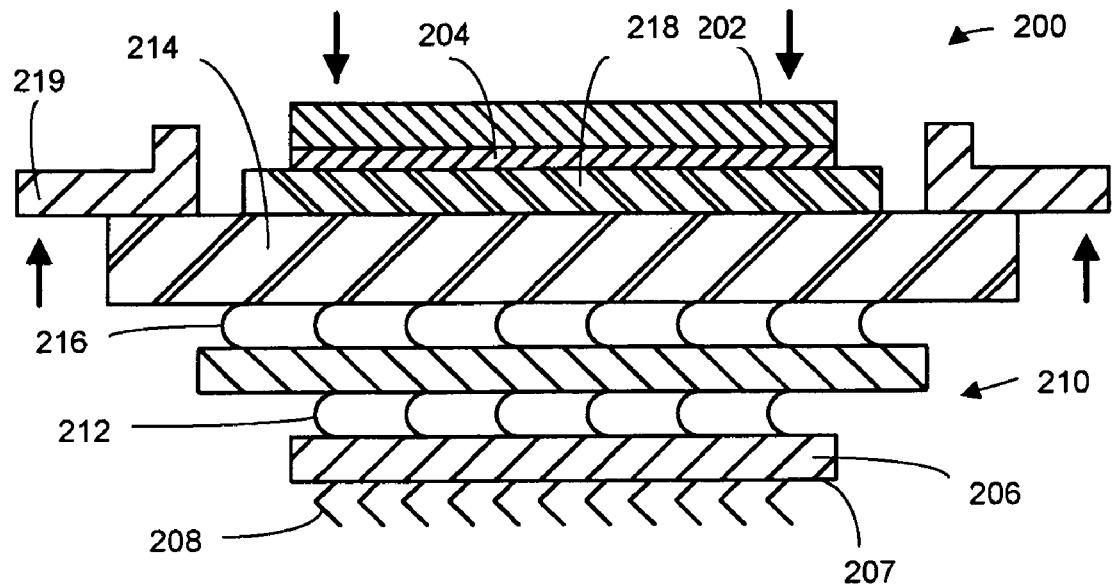
FIG. 5 illustrates a cross-sectional view of a probe card assembly equipped with a thermal adjustment apparatus in accordance with some embodiments of the invention.

FIG. 5 illustrates a probe card assembly 200 equipped with a thermal adjustment apparatus comprising a compensating element 202 and a coupling mechanism 204 in accordance with some embodiments of the invention. The probe card assembly 200 can include, but is not limited to, a probe support substrate 206 having a first surface 207 from which a plurality of probes 208 (e.g. spring contacts) extend. The probes 208 can be made of a resilient material with desired electrical conductivity for conducting electrical signals. The probes 208 can be a composite structure where layers of materials are coated one on another in order to obtain desired mechanical and electrical characteristics for the probes 208 to form pressure contacts with pads on DUTs (not shown in this figure). Examples of probes 208 are disclosed in U.S. Pat. Nos. 6,184,053 B1; 5,974,662; and 5,917,707. However, many other contacts are known in the industry (e.g., needle contacts and cobra-style contacts) and any such contact may be included in any embodiment of the present invention. Note that although there are ten probes drawn in this figure, the number of probes is by no means limited to ten, and can be more or less than ten.

The probe support substrate 206 can be used to support the probes 208 and can be made of one or more materials, such as ceramic, semiconductor, polymeric, composite materials, or any other suitable materials. The probe support substrate 206 can have a coefficient of thermal expansion close to that of the DUT (not shown in the figure) brought in contact with the probe card assembly 200, such that the probes 208 and the pads (not shown in the figure) of the DUT can remain in contact during testing, as the probe support substrate 206 and the DUT would expand or contract at the same or near rate as the temperature changes. Note that although there is only one probe support substrate 206 drawn in the figure, the number of probe support substrates in a probe card assembly is by no means limited to one, and can be more than one.

The probe support substrate 206 can comprise interconnection traces electrically coupling the probes 208 to conductive lines 212 of an interconnect structure (e.g., interposer 210) via traces (not shown) in the probe support substrate 206. The interposer 210 can comprise interconnection traces further electrically coupling the conductive lines 212 to a circuit board substrate 214 via its internal traces (not shown) and conductive lines 216. Although described as an interposer 210, many other types of interconnect structures can be used (e.g., flexible connectors, ribbon cable, and the like). A stiffening structure, such as an inner stiffener 218 and an outer stiffener 219, can be provided above circuit board substrate 214 and can be mechanically attached to the circuit board substrate 214.

As discussed above, the planarity and the z-soak time of the probe card assembly 214 can be important metrics in the effectiveness and performance of the probe card assembly 214. The planarity of the tips of probes 208 can determine, among other things, whether the probes 208 are in a desired contact position with the pads on the DUTs. The z-soak time can determine, among other things, how quickly the probe card assembly 200 can reach thermal equilibrium, and be ready for testing. As also discussed above, since the coefficient of thermal expansion of the circuit board substrate 214 can often differ from that of the stiffener 218, as the temperature of the environment in which the probe card assembly 200 is placed changes, the planarity and the soak time of the probe card assembly 200 can be affected, thereby causing the probes 208 to move in undesired ways, possibly affecting test outcomes.

The circuit board substrate 214 can be patterned with internal and/or external electrical wirings (not shown) and I/O terminals adapted to be connected to a test head (not shown in the drawing), which is adapted to be further connected to a tester equipped with signal processing capability for sending test signals to and receiving test result signals from the DUT via the probe card assembly 200. The circuit board substrate 214 can be typically in a form of a printed circuit board, even though other substrates, such as semiconductor, ceramic, or metallic ones, can be used, whereas the stiffener 218 can be made of a metallic material, alloy or other suitable materials. The stiffener 218 can have a coefficient of thermal expansion smaller than a coefficient of thermal expansion of the circuit board substrate 214. As a result, as the temperature increases, the circuit board substrate 214 can expand at a higher rate than the stiffener 218 does. This can result in a thermal stress forcing the composite structure of the circuit board substrate 214 and the stiffener 218 to bow down—that is the outer parts of the composite structure tends to have an upward displacement as opposed to the center thereof. To the contrary, as the temperature decreases, the circuit board substrate 214 tends to contract at a higher rate than the stiffener 218 does. This can result in a thermal stress forcing the composite structure of the circuit board substrate 214 and the stiffener 218 to bow up—that is the outer parts of the composite structure tends to have a downward displacement as opposed to the center thereof. Note that the relationship of the coefficients of thermal expansion for the circuit board substrate 214 and the stiffener 218 as described above is merely an example for purposes of description. For example, the coefficient of thermal expansion of the circuit board substrate 214 can be less than that of the stiffener 218, such that the composite structure of the circuit board substrate 214 and the stiffener 218 tends to bow up as the temperature increases, and bow down as the temperature decreases.

According to some embodiments of the invention, a compensating element 202 can be attached to the stiffener 218 via a coupling mechanism 204 on one or more sides of the stiffener 218 opposite to the circuit board substrate 214 to counteract the thermal movement of the composite structure of the circuit board substrate 214 and the stiffener 218. The compensating element 202 can be designed to, for example, bow down when the composite structure of the circuit board substrate 214 and the stiffener 218 bows up, and to bow up when the composite structure bows down, thereby creating a counteracting force to keep the circuit board substrate 214 and/or probes 208 substantially planar within a desired tolerance. For example, where the composite structure of the circuit board substrate 214 bows down as temperature increases, the compensating element 202 can be made from materials having a higher coefficient of thermal expansion compared to that of the composite structure. Suitable material choices of the compensating element 202 can be, for example, aluminum, stainless steel, plastic, and other materials satisfying the desired criteria.

The thermal counteracting force of compensating element 202 can be adjusted by altering one or more characteristics of the coupling mechanism 204 and/or the compensating element 202. The characteristics which can be altered or actively controlled can include one or more of the following: mechanical coupling between the two, thermal coupling between the two, geometric considerations of one or both of the two, temperatures of the compensating element 202, the stiffness of the compensating element 202, and any combinations thereof. For example, the compensating element 202 can be mechanically attached to the stiffener 218 by the coupling mechanism 204, such as one or more screws, bolts and nuts, pins, nails, rivets, adhesive, soldering, welding, fitting mechanisms, or other suitable attachment mechanisms. Altering the coupling mechanism 204 can adjust the mechanical resistance between the compensating element 202 and the stiffener 218, thereby adjusting the counteracting force of the compensating element 202. For example, tighter mechanical coupling between the compensating element 202 and the stiffener 218, the more the compensating element's characteristics will affect the stiffener 218. On the other hand, the looser the mechanical coupling between the compensating element 202 and the stiffener 218, the less the compensating element's characteristics will affect the stiffener 218.

The counteracting force of the compensating element 202 can also be adjusted by altering the thermal characteristics of the coupling mechanism 204. For example, the coupling mechanism 204 can be designed to control the thermal gradient between the compensating element 202 and the stiffener 218. The thermal balance between the compensating element 202 and the stiffener 218 can therefore be controlled and the counteracting force be adjusted. For example, the coupling mechanism 204 can be designed to provide tighter or looser thermal coupling between the compensating element 202 and the stiffener 218 affecting how quickly the temperature of the stiffener 218 affects the temperature of the compensating element 202 (or vice versa)—where the more tightly the thermal coupling the more quickly heat moves between the stiffener 218 and the compensating element 202. This can cause a more rapid thermal activation of the compensating element 202 and hence a more rapid impact of the compensating element 202 upon the rest of the structure.

The counteracting force of the compensating element 202 can also be adjusted by altering the geometric considerations of one or both of the coupling mechanism 204 and the compensating element 202. For example, thermal material properties, mechanical material properties, and the geometry of the compensating element 202 can be altered to adjust the counteracting force. The relative positions between the compensating element 202 and the stiffener 218 can be altered to adjust the counteracting force. For example, the coupling mechanism 204 can be in a form of one or more elongated columns that increase a distance between the compensating element 202 and the stiffener 218. Such elongated columns can provide the compensating element 202 with leverage to adjust the counteracting force applied to the stiffener 218 as compared to a smaller distance.

The counteracting force of the compensating element 202 can also be designed as a function of the temperature. For example, the materials of the compensating element 202 and/or the coupling mechanism 204 can be selected to have desired coefficients of thermal expansion sensitive to temperature. The compensating element 202 and the coupling mechanism 204 can also be designed to have self-correcting characteristics to provide a contracting force responsive to the change of temperature and a thermally induced movement of the composite structure of the circuit board substrate 214 and the stiffener 218.

One or more of the above manners of adjusting the counteracting force can be utilized in combination to achieve a desired planarity and/or z-soak time for the probe card assembly 200. Various embodiments and examples are discussed in greater detail with reference to various drawings in paragraphs below.

Figure 6A:
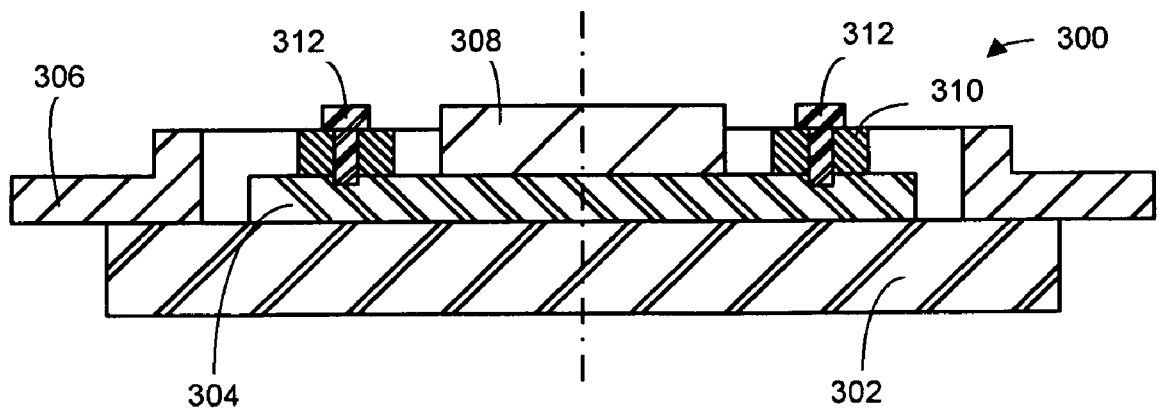
FIGS. 6A-6D illustrate various examples of the thermal adjustment apparatus utilizing at least one mechanical coupling mechanism in accordance with some embodiments of the invention.
Figure 6B:
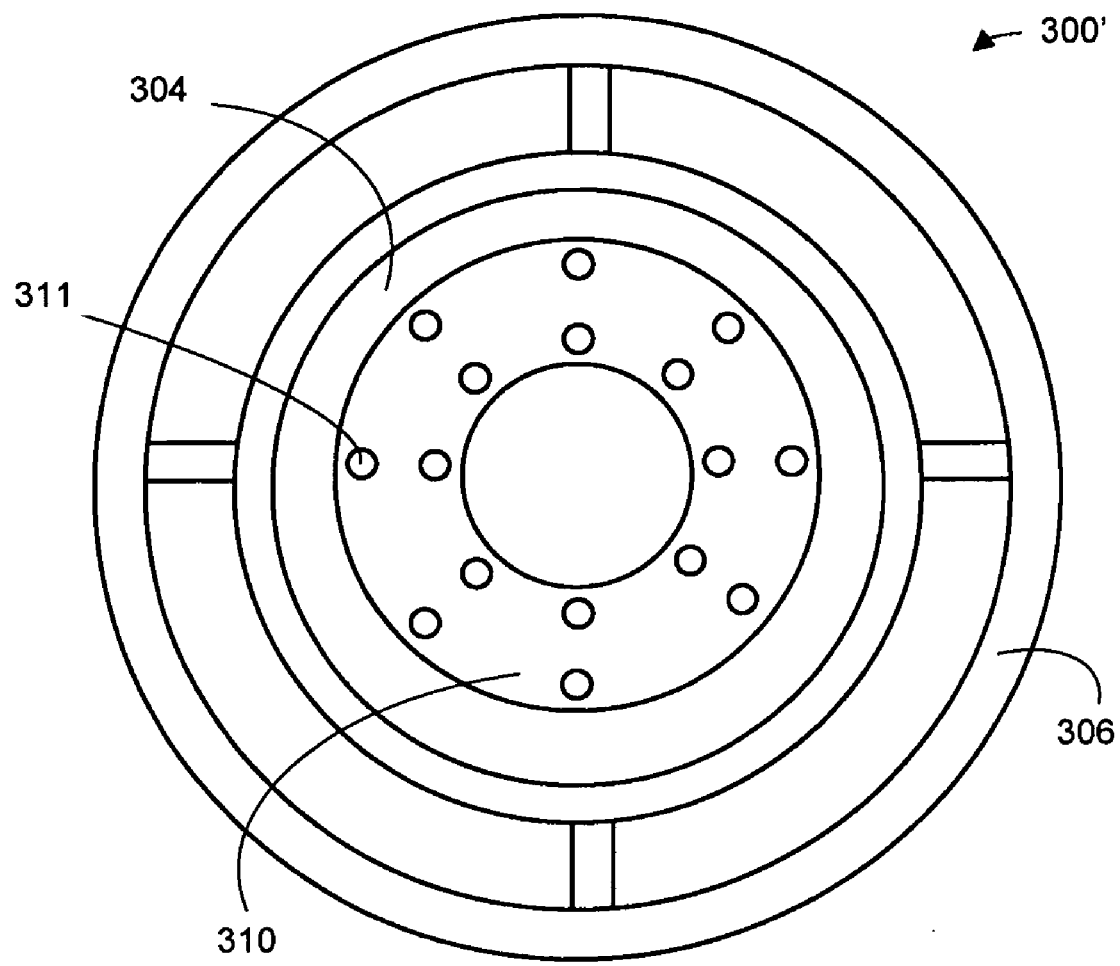
Figure 6C:
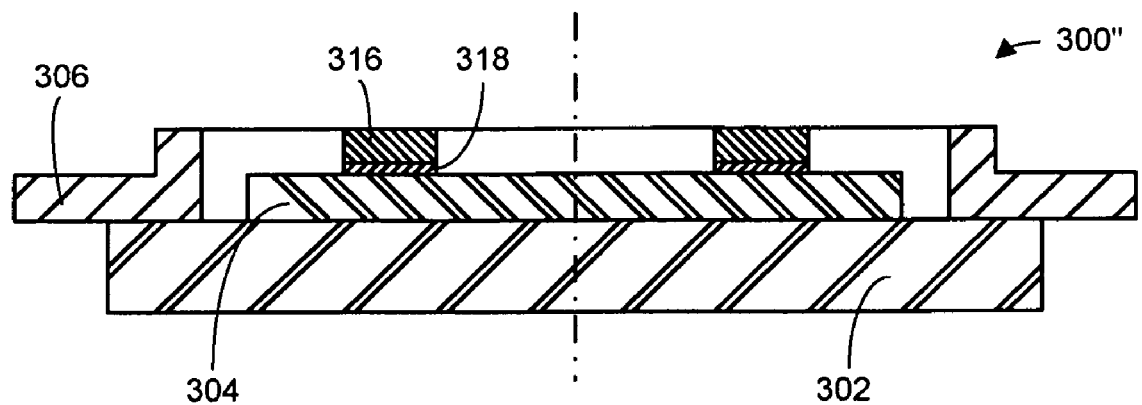

FIGS. 6A-6C illustrate various examples of a thermal adjustment apparatus utilizing at least a mechanical coupling mechanism in accordance with some embodiments of the invention, which can be an example of a compensating element and a coupling mechanism as described above. Referring to FIG. 6A, a thermal adjustment apparatus 300 can be provided to counteract the thermally induced movement of a composite structure, which according to some embodiments can be a circuit board substrate 302, an inner stiffener 304, and an outer stiffener 306, all which can be parts of a probe card assembly 200 similar to that shown in FIG. 5. According to some embodiments, the inner stiffener 304 can be a separate component from the outer stiffener 306. The outer stiffener 306 can be attached to the circuit board substrate 302 at selected connection points (not shown). The connection points can provide for relative movement between the circuit board substrate 302 and the outer stiffener 306 in a direction extending from a centerpoint (indicated in FIG. 5 as a vertical broken line). In some embodiments, the inner stiffener 304 and the outer stiffener 306 can be mechanically and/or thermally connected at selected points (not shown). In some embodiments, the selected points can be chosen to provide mechanical connection and permit desired adjustment (e.g., rotation about a center axis A-A, perpendicular to the page) between the inner stiffener 304 and the outer stiffener 306 relative to each other while providing desired thermal connection between the two. In some embodiments, this thermal connection can be chosen to significantly reduce the thermal coupling between the inner stiffener 304 and the outer stiffener 306.

In some embodiments, a docking element 308 can be fixedly attached to an upper surface of the inner stiffener 304 opposite the circuit board substrate 302, and be adapted to be removably attached to an external device, such as a test head (not shown). Note that the inner stiffener 304 and the outer stiffener 306, in other embodiments, can be an integral piece (i.e., a single stiffener) or more than two separate pieces.

A compensating element 310 can be configured to have a ring-type of shape, and fixedly or removably attached to an upper surface of the inner stiffener 304 opposite the circuit board substrate 302 by a coupling mechanism 312. The compensating element 310 can have a selected coefficient of thermal expansion that allows it to counteract a thermally induced movement of the composite structure of the circuit board substrate 302 and the inner stiffener 304. The coupling mechanism 312 can be adjusted to control a mechanical force attaching the compensating element 310 to the inner stiffener 304. In the example with reference to FIG. 6A, the coupling mechanism 312 can be configured to comprise one or more screws extending through the compensating element 310 into the inner stiffener 304. Adjusting the tightness and/or number of the screws 312 can change the mechanical coupling between the compensating element 310 and the inner stiffener 304, and therefore adjusting the force counteracting the thermally induced movement of the composite structure of the circuit board substrate 302 and the inner stiffener 304.

Note that the embodiment of the compensating element 310 and the coupling mechanism 312 as shown in FIG. 6A is merely one example. In some embodiments, the compensating element 310 can be an integral plate, or have a regular or irregular shape other than a round shape. In some embodiments, the coupling mechanism 312 can be bolts and nuts, pins, nails, rivets, fitting mechanisms, and/or other types of mechanism suitable for connecting the two. Note that different choices of coupling mechanism 312 create different resistance between the compensating element 310 and the inner stiffener 304, thereby creating different patterns of counteracting force. Note that although there are two screws shown in this figure, the number of screws is by no means limited to two, and it can be more or less than two.

FIG. 6B illustrates a top view of the thermal adjustment apparatus 300' similar but not exactly the same as the thermal adjustment apparatus 300 shown in FIG. 6A according to some embodiments. In the drawing, there are sixteen holes 311 for receiving the coupling mechanism 312, such as screws, bolts and nuts, pins, nails, rivets, fitting mechanisms, and other suitable mechanisms. Those holes 311 can be selectively utilized to achieve various levels of mechanical coupling between the compensating element 310 and the inner stiffener 304. For example, utilizing eight of the holes 311 evenly would create less mechanical coupling between the compensating element 310 and the inner stiffener 304 than it would if all of the holes 311 were selected to receive the coupling mechanism 312. Note that although sixteen holes 311 are shown in FIG. 6B, the number of the holes 311 is by no means limited to sixteen, and can be more or less than sixteen. In some embodiments, the holes 311 can be selected to provide an asymmetric mechanical coupling between the compensating element 310 and the inner stiffener 304 (e.g., more utilization on one side and/or row than the other side).

Referring to FIG. 6C, in some embodiments, a thermal adjustment apparatus 300" can be provided. The thermal adjustment apparatus 300" is similar to the thermal adjustment apparatus 300 except that a compensating element 316 can be coupled to the inner stiffener 304 via a coupling mechanism 318 which can be one or more of an adhesive, solder joints, cladding brazing, welding, diffusion bonding and/or other bonding methods between the compensating element 316 and the inner stiffener 304. Adjusting the composition of the coupling mechanism 318 can change the mechanical coupling between the compensating element 316 and the inner stiffener 304, and therefore the force counteracting the thermally induced movement of the composite structure of the circuit board substrate 302 and the inner stiffener 304. For example, the composition of the adhesive can be altered to provide various strength of adhesion between the compensating element 316 and the inner stiffener 304, thereby adjusting the counteracting force thereof.

Figure 6D:
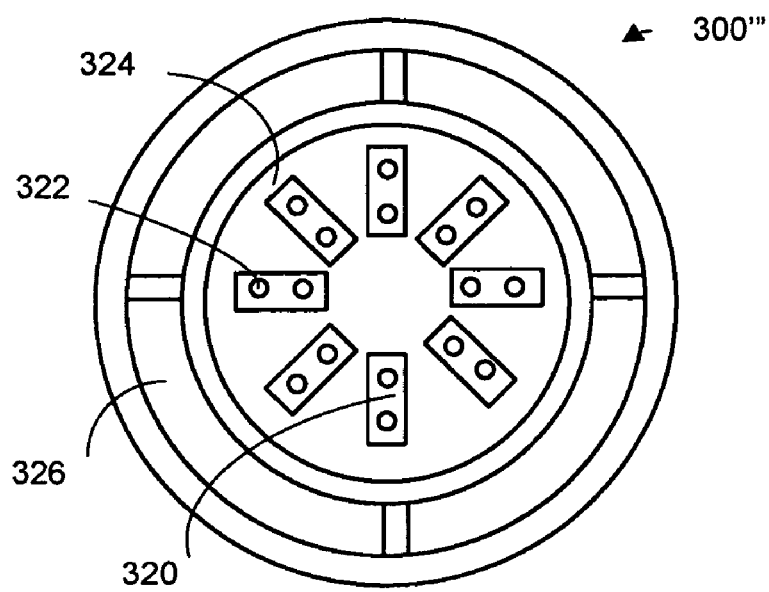

FIG. 6D illustrates a top view of the thermal adjustment apparatus 300''' according to some embodiments of the invention. In the drawing, the compensating element 320 can be implemented as a number of removable parts separate from each other. Each of the parts can be configured to receive the coupling mechanism 322, such as screws, bolts and nuts, pins, nails, rivets, fitting mechanisms, and other suitable mechanisms. Those parts can be adjustably and/or removably attached to an inner stiffener 324 in order to alter the counteracting force applied to the composite structure of the inner stiffener 324 and a printed circuit board 326 thereunder. For example, utilizing four of the parts evenly would create a smaller counteracting force than it would if all of the eight parts were attached to the inner stiffener 324. Note that although eight parts are shown in FIG. 6D, the number of the parts is by no means limited to eight, and can be more or less than eight. The removable parts could also be used in combination to create an expansion effect that was not possible with a single component material. For example, four aluminum parts could be used together with four stainless steel parts to create an expansion that was between the effects of eight aluminum parts and eight steel parts. Alternatively, a mixture of parts for example, two steel parts and one aluminum part could be placed on top of one another. Any combination of the above with any of the materials previously listed could be used to achieve a desired balancing of counteracting forces.

Figure 7:
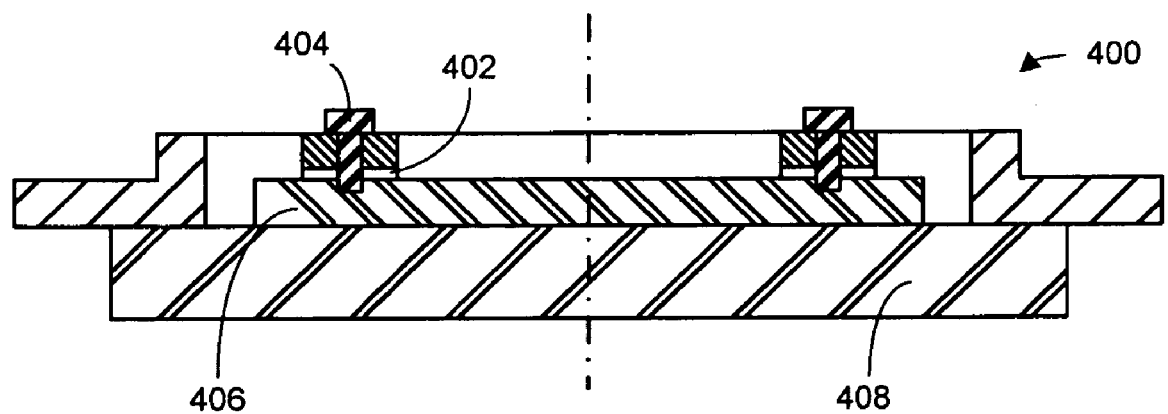
FIG. 7 illustrates various examples of the thermal adjustment apparatus utilizing at least one thermal coupling mechanism in accordance with some embodiments of the invention.

FIG. 7 illustrates a thermal adjustment apparatus 400 utilizing at least a thermal coupling mechanism comprising, for example, a thermal component 402 and a mechanical component 404 in accordance with some embodiments of the invention. The mechanical component 404 can fixedly and/or removably attach the compensating element 402 to the inner stiffener 406. The thermal component 402 can adjust a thermal gradient across the compensating element 402, such that the temperature of the compensating element 402 relative to the inner stiffener 406 can be controlled to adjust the counteracting force of the compensating element 402 against the thermally induced movement of the composite structure of the inner stiffener 406 and the circuit board substrate 408. The thermal component 402 can be made of metal, alloy, semiconductor, plastic, polymer, and/or other suitable materials capable of changing the thermal gradient across the inner stiffener 406 and the compensating element 402. The thermal component 402 can be configured to be in various shapes, such as round, polygon, and/or other regular/irregular shapes. Note that although the mechanical component 404 is drawn as a screw in FIG. 7, it can be any other suitable mechanisms as described in embodiments with reference to FIGS. 6A-6C.

Figure 8A:
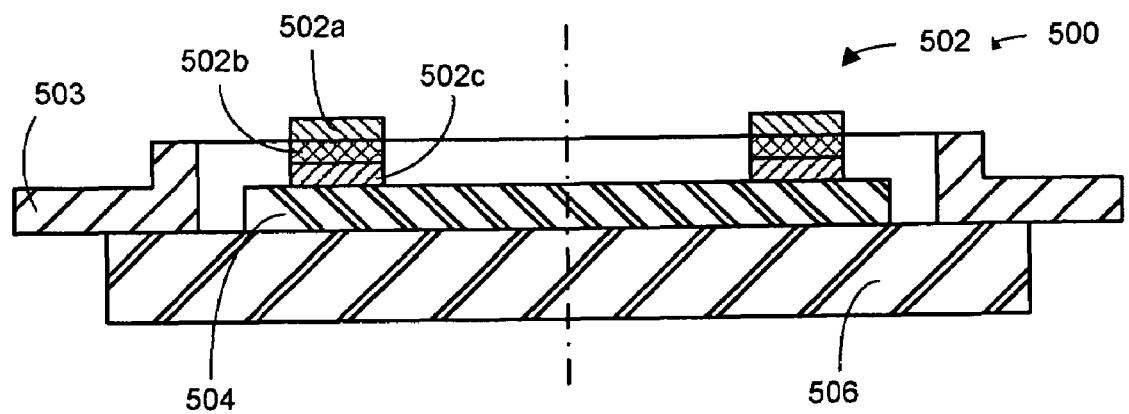
FIGS. 8A-8D illustrate various examples of the thermal adjustment apparatus utilizing at least one coupling mechanism with various geometrical designs in accordance with some embodiments of the invention.

FIGS. 8A-8D illustrate various examples of the thermal adjustment apparatus utilizing at least a coupling mechanism with various geometrical designs in accordance with some embodiments of the invention. Referring to FIG. 8A, a thermal adjustment apparatus 500 can comprise a compensating element 502 including, but not being limited to, a stack of removable components 502a, 502b, and 502c, which can be added to or removed from the thermal adjustment apparatus 500 to provide various patterns of counteracting force against the thermally induced movement of the composite structure of the inner stiffener 504 and the circuit board substrate 506. Note that although there are three removable components drawn in the figure, the number of removable components is by no means limited to three and can be any number more or less than three. Note that although a coupling mechanism is not shown in the figure, any suitable coupling mechanism as described above can be used to attach the removable components to the inner stiffener. For example, according to some embodiments, one or more screws can be threaded through holes (similar to holes 311) in the stack of removable components and into receiving holes in the inner stiffener 504. In FIGS. 8A-8D, the inner stiffener 504, 516, 522 can be similar to inner stiffener 304 and/or 406, and outer stiffener 503 can be similar to outer stiffener 306.

Figure 8B:
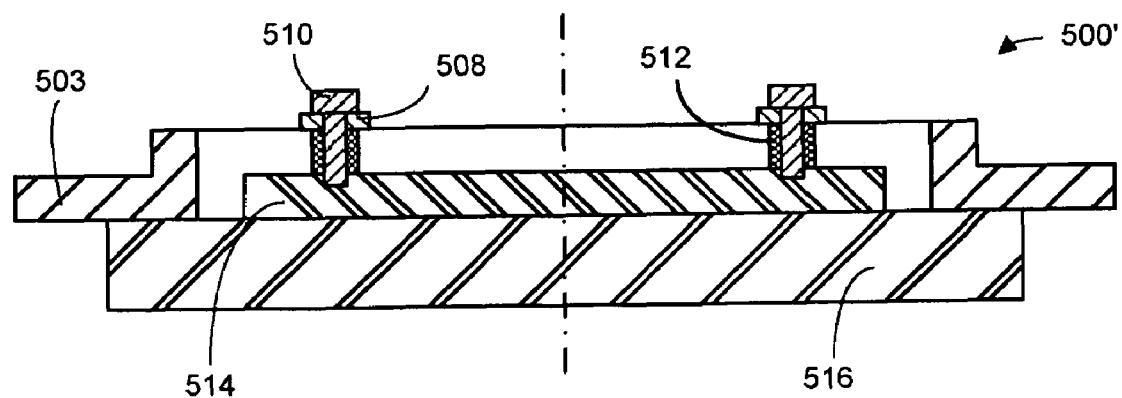

Referring to FIG. 8B, a thermal adjustment apparatus 500' can comprise a compensating element 508 and a coupling mechanism having one or more screws 510 inserted into one or more sleeves 512 elevating the compensating element 508 away from the inner stiffener 514. The sleeves 512 can provide the compensating element 508 with leverage to adjust the counteracting force of the compensating element 508 applied to the inner stiffener 514. Adjusting the elevation of the compensating element 508 can change the pattern of the counteracting force applied to the composite structure of the inner stiffener 514 and the circuit board substrate 516. Note that although there are only two pairs of screws and sleeves are drawn in the figure, their number is by no means limited to two and can be any number more or less than two. Note that although screws and sleeves are drawn in the figure as the coupling mechanism, any suitable coupling mechanism that elevates the compensating element 508 and provides it with leverage can be used to adjust the pattern of the counteracting force.

Figure 8C:
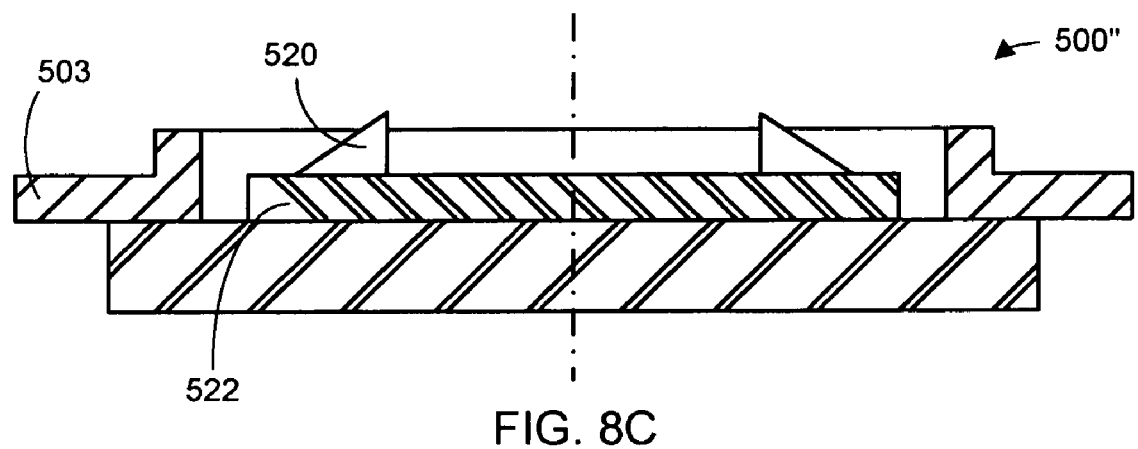
Figure 8D:
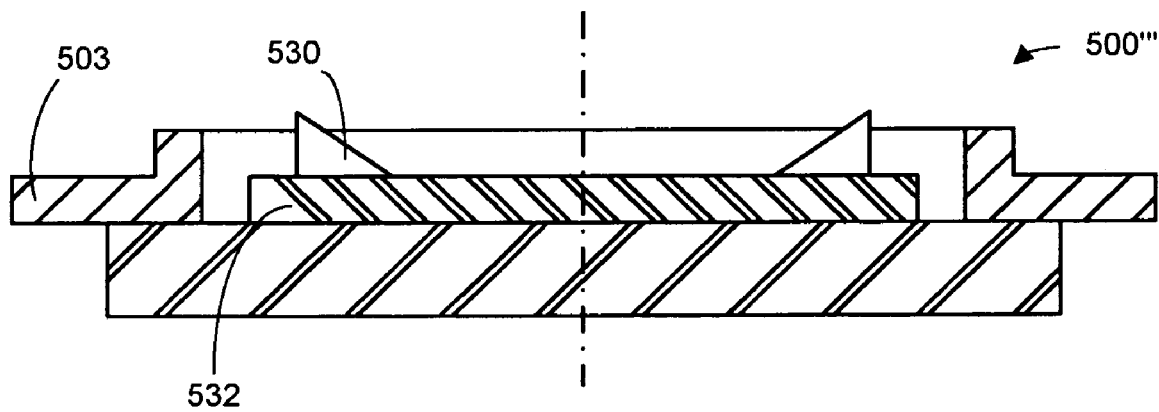

Referring to FIG. 8C, according to some embodiments, a thermal adjustment apparatus 500" can comprise a compensating element 520 having a triangular cross section attached to an inner stiffener 522 by a coupling mechanism (not shown in the figure). Referring to FIG. 8D, a thermal adjustment apparatus 500''' can comprise a compensating element 530 having a triangular cross section attached to an inner stiffener 532 by a coupling mechanism (not shown in the figure). The compensating element 520 can have a triangular cross section with its longest sides facing against each other, whereas the compensating element 530 can have a triangular cross section with its longest sides facing toward each other. Adjusting the geometry of the compensating element 520 or 530 can change the pattern of the counteracting force applied to the inner stiffener 522 or 532. Note that the geometry of the compensating element can have a cross section other than a triangular shape, such as round, polygonal, regular or irregular shapes. Note that although the coupling mechanism is not shown in the figures, any suitable coupling mechanism as described above can be used to attach the compensating element to the inner stiffener. The geometry of 530 would cause resultant forces to be imparted further from the centerline of the stiffener (as compared to the geometry of 520), which is useful in counteracting a deformation of the stiffener that occurs further from the centerline of the structure. Triangular (and other) cross section elements could also be used in combination with any of the above geometries described to enable another degree of control. For example, structural density of triangular cross section parts used in geometries as shown in FIG. 6D could be adjusted along its length with slots or holes. By adjusting the point of attachments, the counter-acting forces can be tuned. Also note that in addition to shapes, the same effect could be achieved by for example a rectangular cross section with varying density of holes, slots or other cut outs.

Figure 9:
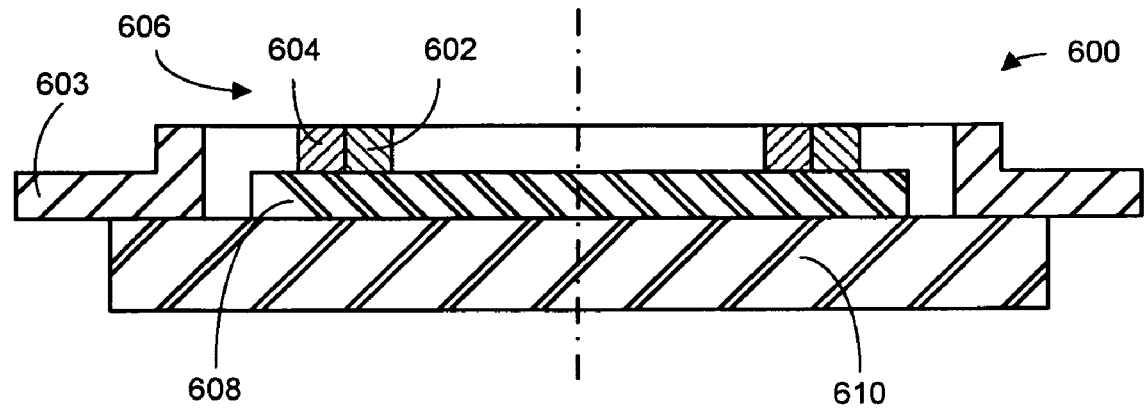
FIG. 9 illustrates various examples of the thermal adjustment apparatus utilizing at least one coupling mechanism with localized thermal zones in accordance with some embodiments of the invention.

FIG. 9 illustrates various examples of the thermal adjustment apparatus 600 utilizing at least a coupling mechanism with localized thermal zones in accordance with some embodiments of the invention. For example, the thermal adjustment apparatus 600 can comprise a compensating element 606 having a first localized thermal zone 602 and a second localized thermal zone 604, wherein the first and second thermal zones can be at different temperatures. Adjusting the temperatures of the localized thermal zones 602 and 604 can allow for the compensating element 606 to change the pattern of the counteracting force applied to the composite structure of the inner stiffener 608 and the circuit board substrate 610. For example, the localized thermal zone 604 on the outside can have a temperature higher than that of the localized thermal zone 602, such that it can apply a greater counteracting force on the outer portion of the composite structure of the inner stiffener 608 and the circuit board substrate 610. Note that although two localized thermal zones are drawn in this figure, the number of the localized thermal zones is by no means limited to two, and can be more or less than two. Note that the localized thermal zones are drawn as arranged horizontally in parallel with the inner stiffener; they can also be arranged vertically, regularly or irregularly without deviating from the spirit of the invention. In FIG. 9, an inner stiffener 608 can be similar to any of the inner stiffeners mentioned above (e.g., 304) and an outer stiffener 603 can be similar to outer stiffener 306.

Figure 10A:
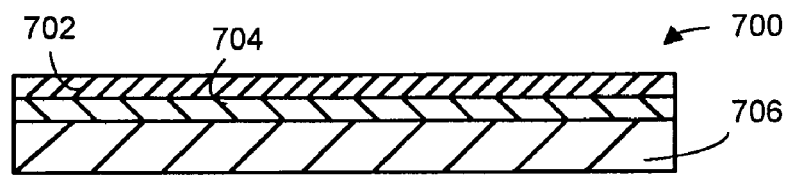
FIGS. 10A-B illustrate various examples of the thermal adjustment apparatus utilizing at least one coupling mechanism with self-correcting characteristics in accordance with some embodiments of the invention.
Figure 10B:
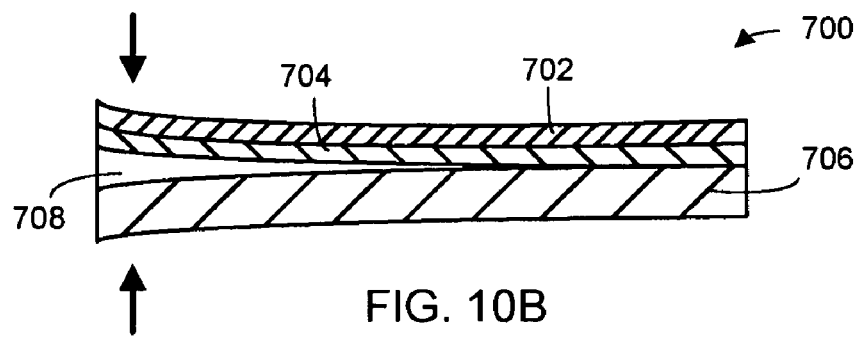

FIGS. 10A-B illustrate various examples of the thermal adjustment apparatus utilizing at least a coupling mechanism with self-correcting characteristics in accordance with some embodiments of the invention. The thermal adjustment apparatus 700 can be a composite structure having a first layer 702 and a second layer 704, wherein the first and second layers 702 and 704 have different coefficients of thermal expansion, such that the thermal apparatus deforms as the temperature changes. The second layer 704 of the thermal adjustment apparatus 700 can be coupled to an underlying object 706, such as a stiffener or a circuit board substrate, by means of, for example, adhesive with a certain degrees resiliency or by mechanical means.

Referring to FIG. 10B as the temperature of the underlying object 706 changes (e.g., increases) it can result in a downward deflection of the underlying object 706 and accordingly an increasing separation between it and the thermal adjustment apparatus 700. This separation can alter the heat transfer between underlying object 706 and the thermal adjustment apparatus 700 (e.g., reducing the thermal transfer and causing the thermal adjustment apparatus to begin to cool). As the thermal adjustment apparatus begins to cool, the thermal adjustment apparatus can be designed to deflect in an upward direction (e.g., by for example providing second layer 704 as a material having a lower CTE than first layer 702). Alternatively, thermal adjustment apparatus 700 can be provided with an initial separation whereby as underlying object 706 upwardly deflects in response to a temperature change, the thermal contact between the thermal adjustment apparatus 700 and the underlying object 706 can increase and resulting in a deflection of the thermal adjustment apparatus in a downward deflection. The described self-correcting mechanisms can be utilized to provide the thermal adjustment apparatus 700 with self-adjustment capability to achieve better planarity for the underlying object.

Figure 11:
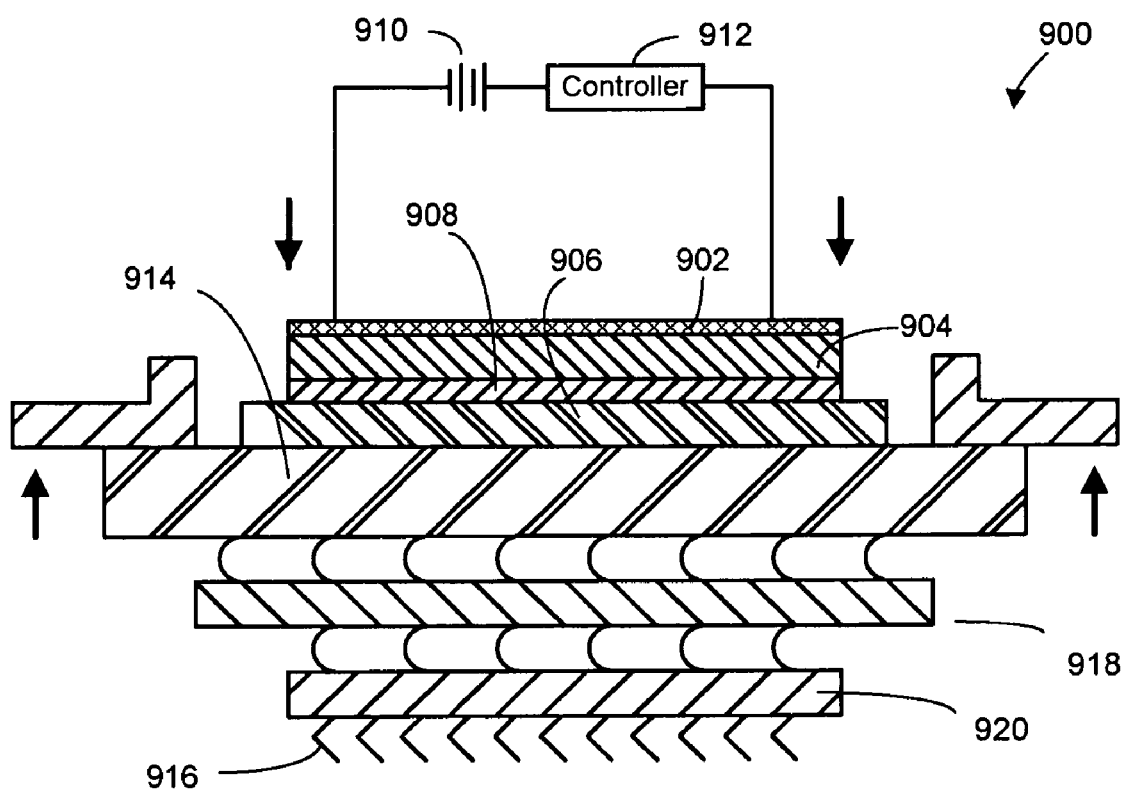
FIG. 11 illustrates a cross-sectional view of a probe card assembly equipped with a thermal adjustment apparatus in accordance with some embodiments of the invention.

FIG. 11 illustrates a cross-sectional view of a probe card assembly 900 equipped with a thermal adjustment apparatus in accordance with some embodiments of the invention. The probe card assemble 900 can be similarly configured as the probe card assembly 200 shown in FIG. 5, except that the thermal adjustment apparatus in the probe card assembly 900 can include a temperature control element 902 attached to a compensating element 904 coupled to an inner stiffener 906 via a coupling mechanism 908. The temperature control element 902 can be coupled to a power supply 910 via a controller 912, which can control the current (power, voltage, . . . etc.) flowing through the temperature control element 902 from the power supply 910. For example, the temperature adjustment element 902 can be made of Peltier-effect material, which can convert a change of electrical potential into a change of material temperature or vice versa. As another example, the temperature adjustment element 902 can be a Kapton heater suitable to be implemented under space and weight constraints. As discussed above, the compensating element 904 and the coupling mechanism 908 can counteract thermally induced movements of the composite structure comprised of, among other things, the inner stiffener 906 and a circuit board substrate 914. In addition, the controller 912 can control the temperature control element 902 to alter the temperature of the compensating element 904 in order to adjust the counteracting force it applies to the composite structure of the inner stiffener 906 and the circuit board substrate 914. For example, the controller 912 can control the temperature control element 902 to increase the temperature of the compensating element 904 in order to increase the counteracting force it applies to the composite structure of the inner stiffener 906 and the circuit board substrate 914. As another example, the controller 912 can control the temperature control element 902 to lower the temperature of the compensating element 904 in order to reduce the counteracting force it applies to the composite structure of the inner stiffener 906 and the circuit board substrate 914.

It is noted that the probe card assembly 900 is merely a non-limiting example showing how the temperature adjustment element 902 can be implemented to alter the counteracting force. It is understood that the temperature adjustment element 902 can also be applied to all the embodiments described above with reference to FIGS. 3-10. It is also noted the temperature adjustment element 902 can be powered by energy other than electricity. For example, the temperature adjustment element 902 can be powered by solar (e.g., optical) energy, mechanical energy (e.g., pressure induced temperature change), and chemical energy.

The temperature control element 902 enables in situ, proactive adjustment of the counteracting force of the compensating element 904 when the temperature of an environment where the probe card assembly 900 is placed changes. Such in situ, proactive adjustability of counteracting force can improve planarity of the circuit board substrate 914, and therefore planarity of a probe support substrate 920 coupled to the circuit board substrate 914 via an interposer 918. As a result, tips of probes 916 extending from the probe support substrate 920 can be properly maintained on a plane, thereby enabling the probes 916 to form proper electrical contacts with terminals of DUTs.

In some embodiments of the invention, one or more sensors (not shown in the figure) can be implemented in the probe card assembly 900 to detect local temperatures and/or thermal movements of various parts thereof, and provide the controller 912 with feedback signals indicating the local temperatures and thermal movements detected. The sensors can be temperature sensing devices or strain measuring devices on any of the components of the probe card assembly 900. In some other embodiments, the sensors can be cameras or distance sensors that monitor the displacements of any components of the probe card assembly 900. The controller 912 can control the temperature control element 902 in response to the feedback signals, such that the compensating element 904 can be maintained at a proper temperature in order to provide a proper counteracting force against thermally induced movements of the composite structure of the inner stiffener 902 and the circuit board substrate 914.

In some embodiments of the invention, the temperature control element 902 can be placed between the compensating element 904 and the coupling mechanism 908, between the coupling mechanism 908 and the inner stiffener 906, or between the inner stiffener 906 and the circuit board substrate 914. In some embodiments of the invention, the temperature control element 902 can be integrated with the compensating element 904 or the coupling mechanism 908. In some embodiments of the invention, the temperature control element 902 can be attached to, implemented in, placed within, and/or integrated with various exemplary thermal adjustment apparatuses as described above with reference to FIGS. 6A-10B. Such attachment, implementation, placement, and/or integration can be understood by people skilled in the art without undue experiment in light of this invention disclosure. For purposes of clarify, specific examples of applying the temperature control element to the embodiments of the invention described with reference to FIGS. 6A-10B are omitted without limiting the scope of the same.

Figure 12:
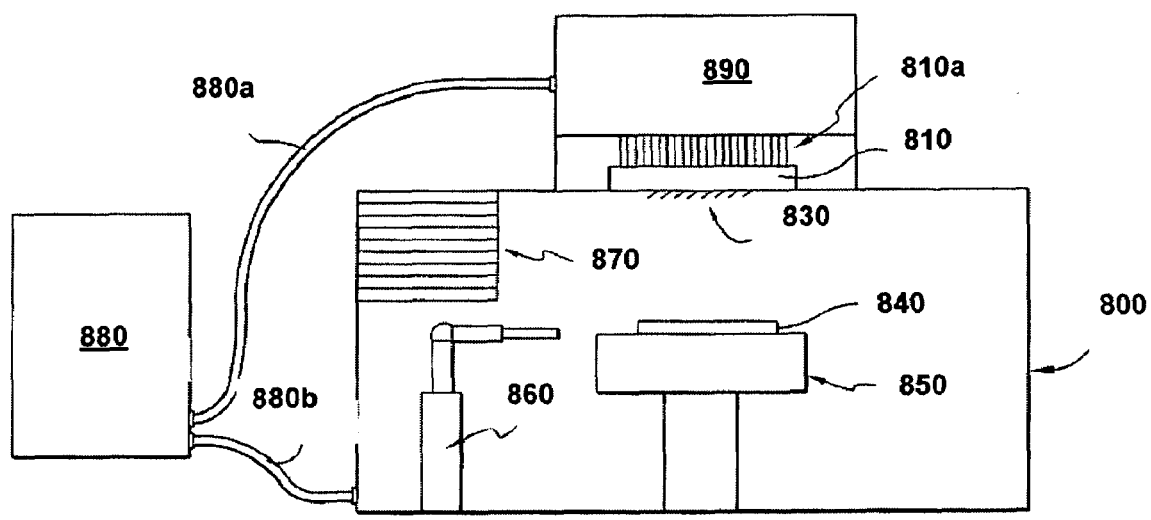
FIG. 12 is a front diagrammatic view of a prober and a tester connected by communication cables for using injunction with probe card assemblies in accordance with some embodiments of the invention.

FIG. 12 shows diagrammatic views of one example of a prober and a tester usable in connection with the present invention. In some embodiments, the prober 800 can be physically separate from the tester 880. They can be connected by one or more cables, such as communication cables 880a and 880b as illustrated. The cable 880a can connect to a test head 890 which can be connected to a probe card 810 by electrical connections 810a. In this embodiment, wafers, such as a wafer 840 on a stage 850, may be placed from a wafer boat 870 by a robotic arm 860. The tester 880 can generate test data which is sent to the test head 890 via the communications cable 880a and may receive response data from the test head 890 via the communications cable 880a. The test head 890 can receive data from the tester 880 and pass the test data through the probe card 810 to the wafer 840 with or without additional processing. Data from the wafer can be received through the probe card 810 and sent to the tester 880 with or without additional processing. The prober 800 houses the wafer boat 870, stage 850, and robotic arm 860 as illustrated. The tester 880 may control the prober 800 in a variety of ways, using the communication cable 880b. The wafer boat 870 stores wafers to be tested or that have been tested. The stage 850 supports the wafer being tested, typically moving it vertically and horizontally. Typically, the stage 850 is also capable of being tilted and rotated and is capable of moving the wafer being tested against the probes 830. This may comprise a wafer chuck and table actuator as previously described. The robotic arm 860 moves wafers between stage 850 and the wafer boat 870.

The tester 880 is typically a computer, and the prober 800 typically also includes a computer or at least a computer-like control circuitry (e.g. a microprocessor or microcontroller and microcontroller or microcode). Test head 890 may similarly include computer or computer-like control circuitry.

This may be an existing computer, or computer-like control circuitry already in the prober 800 or alternatively a new computer added to the prober 800 for this purpose. Alternatively, the computer may be located in the tester 880, in which case feedback signals regarding the position of the wafer with respect to the probe card 810 would be typically communicated to the tester via the communication cable 880*b*. The control signals removing the stage 850 are likewise communicated via that cable.

As yet another alternative, the computer may be located in the test head 890 the suitable communication means between the prober 800 and test head 890. Such communication means may be via wired connections, RF transmissions, light or other energy beam transmissions and the like.

Yet another alternative, a separate computer distinct from the tester, test head and prober, could be used and connected electrically to the prober for this purpose.

This invention as described by embodiments and examples allows for quick adjustment of the counteracting force of a thermal adjustment apparatus against thermally induced movement of electro-mechanical assemblies, such as probe cards, on site. This on-site adjustability allows for quickly adjusting the planarity of probe cards, such that they can be utilized to test DUTs without undue delay, thereby saving precious time that otherwise would have been spent on obtaining specialized service in tuning the probes relative to the pads of DUTs. This, in turn, reduces the testing time of DUTs, and therefore improves the yield. This can translate into millions of dollars of cost reduction for electronic device manufacturers as an improvement of operation efficiency.

Although the embodiments and examples of the invention are described in the context of probe card assemblies, the proposed thermal adjustment apparatus can be used to counteract thermally induced movements of any electro-mechanical assemblies where positional accuracy is of essence. One or more of the manners of adjusting the thermal adjustment apparatus, such as mechanical coupling, thermal coupling, material selection, geometrical adjustments, localized temperature zones, and self-correcting mechanisms, can be used in combination to achieve optimal results.

Although specific embodiments and applications of the invention have been described in this specification, there is no intention that the invention be limited these exemplary embodiments and applications or to the manner in which the exemplary embodiments and applications operate or are described herein. For example, particular exemplary test systems have been disclosed, but it will be apparent that the inventive concepts described above can apply equally to alternate arrangements of a test system. Moreover, while specific exemplary processes for testing an electronic device have been disclosed, variations in the order of the processing steps, substitution of alternate processing steps, elimination of some processing steps, or combinations of multiple processing steps that do not depart from the inventive concepts are contemplated. Accordingly, it is not intended that the invention be limited except as by the claims set forth below.

We claim:

1. A thermal adjustment apparatus for adjusting one or more thermally induced movements of an electro-mechanical assembly, the thermal adjustment apparatus comprising:
   a compensating element expanding at a first rate different from a second rate at which the electro-mechanical assembly expands for generating a counteracting force in response to changes in temperature, wherein the compensating element has a generally circular shape; and
   a coupling mechanism mechanically coupling the compensating element to the electro-mechanical assembly, and being adjustable to control an amount of the counteracting force applied to the electro-mechanical assembly as temperature changes.

2. The thermal adjustment apparatus of claim 1, wherein the electro-mechanical assembly comprises a probe card assembly for testing integrated circuits.

3. The thermal adjustment apparatus of claim 1, wherein the coupling mechanism is adjustable to alter a mechanical coupling force between the compensating element and the electro-mechanical assembly.

4. The thermal adjustment apparatus of claim 3, wherein the coupling mechanism comprises one or more attachment mechanisms including screws threaded through holes in the compensating element and the electro-mechanical assembly, bolts and nuts, nails, pins, rivets, fitting mechanisms, and any combination thereof.

5. The thermal adjustment apparatus of claim 4, wherein changing a number of the attachment mechanisms utilized and/or tightness of the attachment mechanisms alters the mechanical coupling force.

6. The thermal adjustment apparatus of claim 3, wherein the coupling mechanism comprises one or more of adhesive, brazing, soldering, welding, and any combination thereof.

7. The thermal adjustment apparatus of claim 6, wherein changing a composition of the adhesive, the soldering, the brazing, and/or the welding alters the mechanical coupling force.

8. The thermal adjustment apparatus of claim 1, wherein the coupling mechanism is configurable to alter a thermal coupling gradient across the compensating element and the electro-mechanical assembly.

9. The thermal adjustment apparatus of claim 1, wherein geometrical features of the compensating element and the coupling mechanism are configurable to alter the counteracting force.

10. The thermal adjustment apparatus of claim 1, wherein the compensating element comprises one or more moveable parts adjustably and/or removably disposed on the electro-mechanical assembly by the coupling mechanism.

11. The thermal adjustment apparatus of claim 1, wherein the coupling mechanism provides the compensating element with leverage to adjust the counteracting force applied to the electro-mechanical assembly.

12. The thermal adjustment apparatus of claim 11, wherein the coupling mechanism comprises one or more sleeves that increase the leverage between the compensating element and the electro-mechanical assembly.

13. The thermal adjustment apparatus of claim 1, wherein the compensating element has a wedge, regular, and/or irregular shape.

14. The thermal adjustment apparatus of claim 1, wherein the compensating element has one or more localized thermal zones with various temperatures, wherein the temperatures of the localized thermal zones are separately configurable to control the counteracting force of the compensating element applied to the electro-mechanical assembly.

15. The thermal adjustment apparatus of claim 1, wherein the coupling mechanism comprises a self-correcting mechanism that enables the compensating element to change the counteracting force automatically in response to a change of temperature.

16. The thermal adjustment apparatus of claim 1, wherein the compensating element is made of one or more materials having one or more coefficients of thermal expansion that are temperature sensitive.

17. The thermal adjustment apparatus of claim 1 further comprising a temperature control element configurable to actively increase or decrease a temperature of the compensating element and/or the coupling mechanism.

18. The thermal adjustment apparatus of claim 17 further comprising a controller for controlling the temperature control element to set the temperature of the compensating element and/or the coupling mechanism.

19. The thermal adjustment apparatus of claim 17 further comprising a sensor for sensing a temperature and/or strain of the electro-mechanical assembly, or for monitoring a deflection of the electro-mechanical assembly.

20. A process for adjusting an amount of coupling comprising:
providing a compensating element that has a generally circular shape;
providing an electro-mechanical assembly; and
adjusting a mechanical coupling between the compensating element and the electro-mechanical assembly in accordance with a predetermined amount of thermal movement of the electro-mechanical assembly.

21. The process of claim 20, wherein the adjusting comprises altering a mechanical coupling force between the compensating element and the electro-mechanical assembly.

22. The process of claim 21, wherein the altering the mechanical coupling force comprises adjusting one or more attachment mechanisms including screws threaded through holes in the compensating element and the electro-mechanical assembly, bolts and nuts, nails, pins, rivets, fitting mechanisms, and any combination thereof.

23. The process of claim 22, wherein the altering the mechanical coupling force comprises changing a number of the attachment mechanisms utilized and/or tightness of the attachment mechanisms.

24. The process of claim 22, wherein the attachment mechanism comprises one or more of adhesive, brazing, soldering, welding, and any combination thereof.

25. The process of claim 24, wherein the altering the mechanical coupling force comprises changing a composition of the adhesive, the soldering, the brazing, and/or the welding.

26. The process of claim 20, wherein the adjusting comprises altering a thermal coupling gradient across the compensating element and the electro-mechanical assembly.

27. The process of claim 20, wherein the adjusting comprises altering geometrical features of the compensating element and the coupling mechanism.

28. The process of claim 27, wherein the compensating element comprises one or more moveable parts adjustably and/or removably disposed on the electro-mechanical assembly by the coupling mechanism.

29. The process of claim 20 further comprising providing the compensating element with leverage to adjust the coupling applied to the electro-mechanical assembly.

30. The process of claim 20 further comprising providing one or more localized thermal zones with temperatures that are separately adjustable to control the coupling between the compensating element and the electro-mechanical assembly.

31. The process of claim 20, wherein the coupling is self correcting such that the coupling changes automatically in response to a change of temperature.

32. The process of claim 20 further comprising providing a temperature control element for configurably increasing or decreasing a temperature of the compensating element, thereby altering the coupling between the compensating element and the electro-mechanical assembly.

33. The process of claim 32 further comprising controlling the temperature control element to set the temperature of the compensating element.

34. The process of claim 32 further comprising sensing a temperature and/or strain of the electro-mechanical assembly.

35. The process of claim 32 further comprising monitoring a deflection of the electro-mechanical assembly.

36. The process of claim 20, wherein the generally circular shape of the compensating element is a generally ring shape with a central opening.

37. The process of claim 36, wherein:
the electro-mechanical assembly comprises a probe card assembly comprising a generally circular circuit board, a generally circular first stiffener disposed to a first side of the circuit board, and a probe substrate disposed to a second side of the circuit board opposite the first side, the probe substrate comprising a plurality of probes for contacting an electronic device to be tested; and
the mechanical coupling is between the compensating element and the first stiffener.

38. The thermal adjustment apparatus of claim 1, wherein the generally circular shape of the compensating element is a generally ring shape with a central opening.

39. The thermal adjustment apparatus of claim 38, wherein:
the electro-mechanical assembly comprises a probe card assembly comprising a generally circular circuit board, a generally circular first stiffener disposed to a first side of the circuit board, and a probe substrate disposed to a second side of the circuit board opposite the first side, the probe substrate comprising a plurality of probes for contacting an electronic device to be tested; and
the coupling mechanism couples the compensating element directly to the first stiffener.

40. The thermal adjustment apparatus of claim 39, wherein the probe card assembly further comprises a second stiffener comprising a ring shape with a central opening, the first stiffener being disposed within the central opening of the first stiffener.

41. The thermal adjustment apparatus of claim 40, wherein the probe card assembly further comprises a docking element coupled to the first stiffener and disposed within the central opening of the compensating element.

* * * * *